(12) United States Patent
Hu et al.

(10) Patent No.: US 12,272,691 B2
(45) Date of Patent: *Apr. 8, 2025

(54) SEMICONDUCTOR AND CIRCUIT STRUCTURES, AND RELATED METHODS

(71) Applicant: TAIWAN SEMICONDUCTOR MANUFACTURING COMPANY LTD., Hsinchu (TW)

(72) Inventors: Chang-Fen Hu, Hsinchu (TW); Shao-Yu Li, Hsinchu (TW); Kuo-Ji Chen, New Taipei (TW); Chih-Peng Lin, Hsinchu (TW); Chuei-Tang Wang, Taichung (TW); Ching-Fang Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/190,936

(22) Filed: Mar. 27, 2023

(65) Prior Publication Data

US 2023/0238380 A1 Jul. 27, 2023

Related U.S. Application Data

(63) Continuation of application No. 17/357,803, filed on Jun. 24, 2021, now Pat. No. 11,646,313.

(60) Provisional application No. 63/159,653, filed on Mar. 11, 2021.

(51) Int. Cl.
*H01L 27/092* (2006.01)
*H01L 23/538* (2006.01)
*H01L 25/00* (2006.01)
*H01L 25/065* (2023.01)

(52) U.S. Cl.
CPC ........ *H01L 27/092* (2013.01); *H01L 23/5383* (2013.01); *H01L 25/0655* (2013.01); *H01L 25/50* (2013.01); *H01L 25/0657* (2013.01)

(58) Field of Classification Search
CPC ............... H01L 23/5383; H01L 27/092; H01L 25/0655; H01L 25/50; H01L 25/0657
See application file for complete search history.

(56) References Cited

U.S. PATENT DOCUMENTS

| | | | | |
|---|---|---|---|---|
| 6,586,266 | B1 * | 7/2003 | Lin | G01R 31/31905 |
| | | | | 257/E21.705 |
| 10,630,296 | B2 * | 4/2020 | Lee | H01L 25/105 |
| 11,049,552 | B1 * | 6/2021 | Raj | G11C 11/4091 |
| 11,646,313 | B2 * | 5/2023 | Hu | H01L 27/092 |
| | | | | 257/369 |
| 2020/0328277 | A1 * | 10/2020 | Jain | H01L 29/151 |
| 2022/0123753 | A1 * | 4/2022 | Liu | H03K 19/1737 |
| 2024/0170488 | A1 * | 5/2024 | Hiremath | H01L 27/092 |

* cited by examiner

*Primary Examiner* — Thao P Le
(74) *Attorney, Agent, or Firm* — WPAT LAW; Anthony King

(57) ABSTRACT

A circuit structure is provided. The circuit structure may include a first die area including an output gate, a second die area including a circuit and an input gate and a die-to-die interconnect. The input gate may include a transistor. The circuit may be connected between the die-to-die interconnect and a gate region of the transistor. The circuit may include a MOS transistor. A first source/drain region of the MOS transistor may be connected to the die-to-die interconnect.

20 Claims, 20 Drawing Sheets

| | Embodiment A | Embodiment B | Remark |
|---|---|---|---|
| Area overhead (total - Rx, unit: um²) | 2.73 | 0.14 | Save area ~ 19x |
| Timing delay (unit: ps) | 28.8 | 17.1 | Faster ~41% |
| Power (uw) | 68.2 | 20.0 | Save 71% power |
| Speed | Lower | Higher | - |

FIG. 8C

SEMICONDUCTOR AND CIRCUIT STRUCTURES, AND RELATED METHODS

PRIORITY CLAIM AND CROSS-REFERENCE

This application claims priority to U.S. patent application Ser. No. 17/357,803, filed on Jun. 24, 2021, which claims priority to U.S. Provisional Application No. 63/159,653 filed on Mar. 11, 2021, entitled "NOVEL DIE-TO-DIE INTERFACE CIRCUITS," which applications are hereby incorporated herein by reference.

BACKGROUND

As technology progresses, the minimum size of the circuit element that can be manufactured in an integrated circuit (IC) continues to reduce. Hence, there is an ever-increasing demand for increasing the number of circuit elements in an IC of the same or smaller size.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 8C illustrates exemplary performance metrics related to some embodiments of the present disclosure.

DETAILED DESCRIPTION OF THE DISCLOSURE

Figure 1:
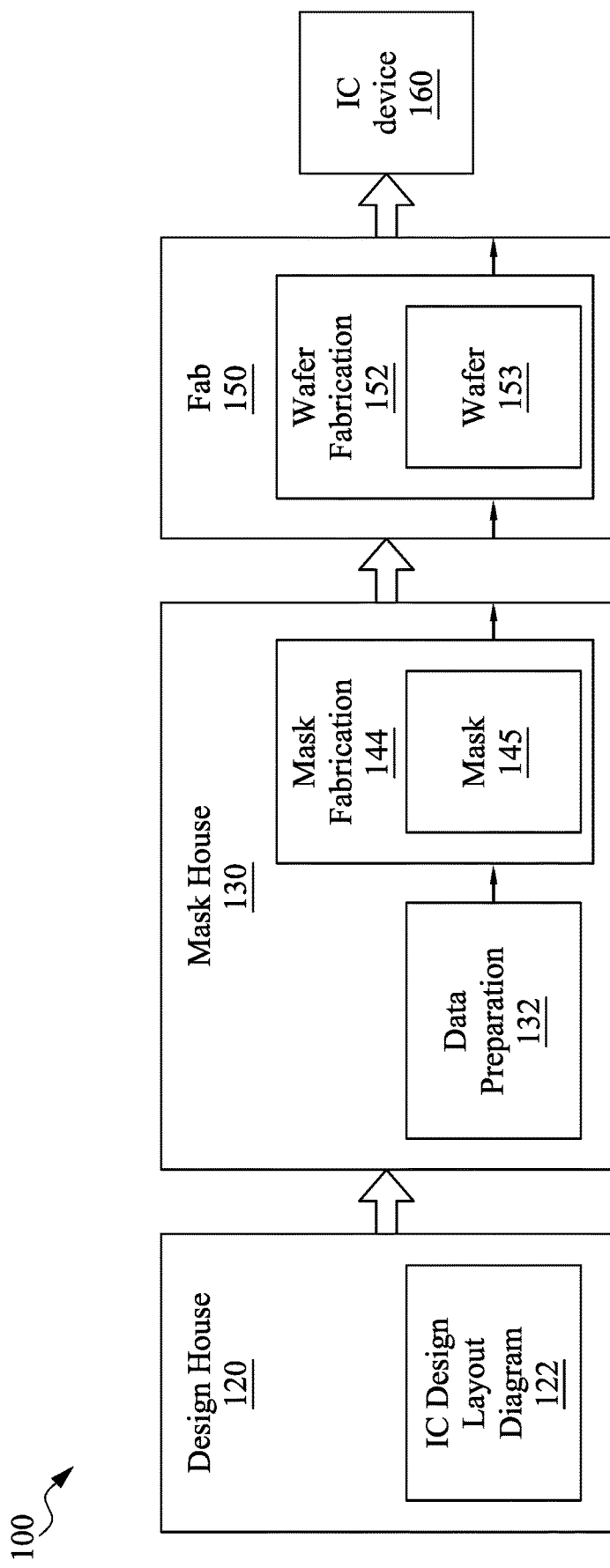
FIG. 1 shows a block diagram of an IC manufacturing system and an associated manufacturing flow, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly.

In the present disclosure, the phrase "one of A, B and C" means "A, B and/or C" (A, B, C, A and B, A and C, B and C, or A, B and C), and does not mean one element from A, one element from B and one element from C, unless otherwise described.

In the present disclosure, expressions such as "about" and "approximately," which precede a value, indicate that the value is exactly as described or within a certain range of the value as described, while taking into account the design error/margin, manufacturing error/margin, measurement error, etc. Such a description should be recognizable to one of ordinary skill in the art.

Embodiments may be discussed with respect to the use of standard cells in the design of application-specific integrated circuits (ASICs), though embodiments are not so limited. A standard cell represents design abstraction that encapsulates a low-level, VLSI (very-large-scale integration) layout into an abstract logic representation (e.g., a NAND gate or other logic gate). Standard cell-based design allows one designer to focus on the logical or functional aspect of digital design, while another designer focuses on the implementation aspect of the design, and is critical in facilitating the efficient design of everything from simple single-function ICs to complex multi-million gate system-on-a-chip (SoC) devices.

In the present disclosure, not every layer of a cell or a layout is depicted in the drawings. One of ordinary skill in the art should understand that the cell or the layout can include more layers to implement functionality of the cell and these layers are omitted merely for convenience of description.

In modern technology, integrated circuits (ICs) are made on a semiconductor wafer (or substrate), of which silicon is a common material. A semiconductor manufacturer fabricates numerous ICs on a wafer. The wafer may be then cut into many chips or dies. The chips or dies are then packaged and tested, and then delivered to customers. An IC package may contain a single chip or multiple chips.

A single-chip package includes one die, which may be attached, bonded and encapsulated into a package body. A die designed for a single-chip package may include dedicated input/output (I/O) circuit blocks for communicating signals between the die and circuitry external to the package.

The dedicated I/O circuit blocks in the die designed for a single-chip package may have several functions, such as driving large capacitance off-chip and protecting the die from unintended electrostatic discharge. The size of the dedicated I/O circuit blocks may depend on the amount of off-chip capacitance the die is designed to drive and/or the specification of the amount of electrostatic discharge protection.

A multiple-chip package, sometimes referred to as multiple-chip module (MCM), includes a plurality of dies assembled in the same package. Advantages of the multiple-chip package include higher integration density and lower package cost. Other advantages include improved system performance that can be attributed to a closer positioning of dies that communicate with each other and the shorter die-to-die interconnection that results.

Another advantage of the multiple-chip package can be that, because at least some of the dies no longer have to drive large capacitance off-chip, the required driving strength for the I/O circuitry of these dies may be reduced, leading to, e.g., a smaller output cell and/or a lower power consumption. The need for dedicated I/O circuit blocks may even be obviated in some of the dies in a multiple-chip package; in these dies, standard logic cells in one die may directly drive signals to another die, via a die-to-die interconnect. Exemplary die-to-die interconnect includes a through-silicon-via (TSV), a through-dielectric-via (TDV) and a hybrid bond.

One factor that is often considered when the chips in a multiple-chip package are designed is the so-called "antenna effect," sometimes referred to as plasma-induced damage (PID) or plasma-induced gate-oxide damage.

To understand the antenna effect, consider two dies that are connected to each other by a die-to-die interconnect (such as a TSV). The die-to-die interconnect is connected between a transistor of an output logic gate of the first die and a transistor of an input logic gate of the second die. The output logic gate of the first die and the input logic gate of the second die can be referred to as a "transmitter" and a "receiver," respectively, because electric signals can be considered as being transmitted from the output logic gate of the first die to the input logic gate of the second die. In some cases, the first die may include an output circuit that is more complicated than an individual logic gate and the second may include an input circuit that is more complicated than an individual logic gate. In these cases, the die-to-die interconnect may be connected between a transistor of the output circuit of the first die and a transistor of the input circuit of the second die. In these case, the output circuit of the first die and the input circuit of the second die may be referred to as the "transmitter" and the "receiver," respectively, without loss of clarity, because electric signals can be considered as being transmitted between these two circuits.

It is not uncommon that electric signals are transmitted from a logic gate of the first die to another logic gate of the second die. When a signal is fed to a logic gate, it is not uncommon that the signal is fed to the gate terminal of an input transistor of the logic gate. Hence, it is not uncommon that the die-to-die interconnect (which is conductive and may be made of metallic material) is directly connected to the gate terminal of a transistor of the input logic gate of the second die.

Some IC manufacturing processes, such as plasma-based etching, may cause electric charges to accumulate in areas having been subject to these processes. The die-to-die interconnect, being conductive, may therefore accumulate electric charges during manufacturing.

The gate terminal of a transistor usually includes a layer of dielectric, such as silicon dioxide. The dielectric layer may be thin, and therefore may break down if directly connected to a large potential. It is not uncommon that the die-to-die interconnect, which may accumulate a large amount of charges, is directly connected to the gate dielectric; therefore, the gate dielectric may run the risk of breaking down by these charges. Hence, it is advantageous to protect the gate dielectric that is directly connected to the die-to-die interconnect from these charges, or PID.

One way to provide such PID protection is to introduce an antenna diode to the circuit node between the die-to-die interconnect and the gate terminal of the input transistor of the second die (the "receiver").

The addition of antenna diodes, though useful in providing PID protection to gate dielectrics, may be less than optimal because antenna diodes may occupy a significant amount of area, which increases manufacturing cost. The area increase may also impose a penalty to other performance metrics such as timing and power consumption. Moreover, since each I/O pin in a die would require its own antenna diode, the sub-optimality may compound rapidly as more I/O pins are placed in the die.

Therefore, an improved manner of providing PID protection to gate dielectrics directly connected to die-to-die interconnects would be advantageous.

Figure 2A:
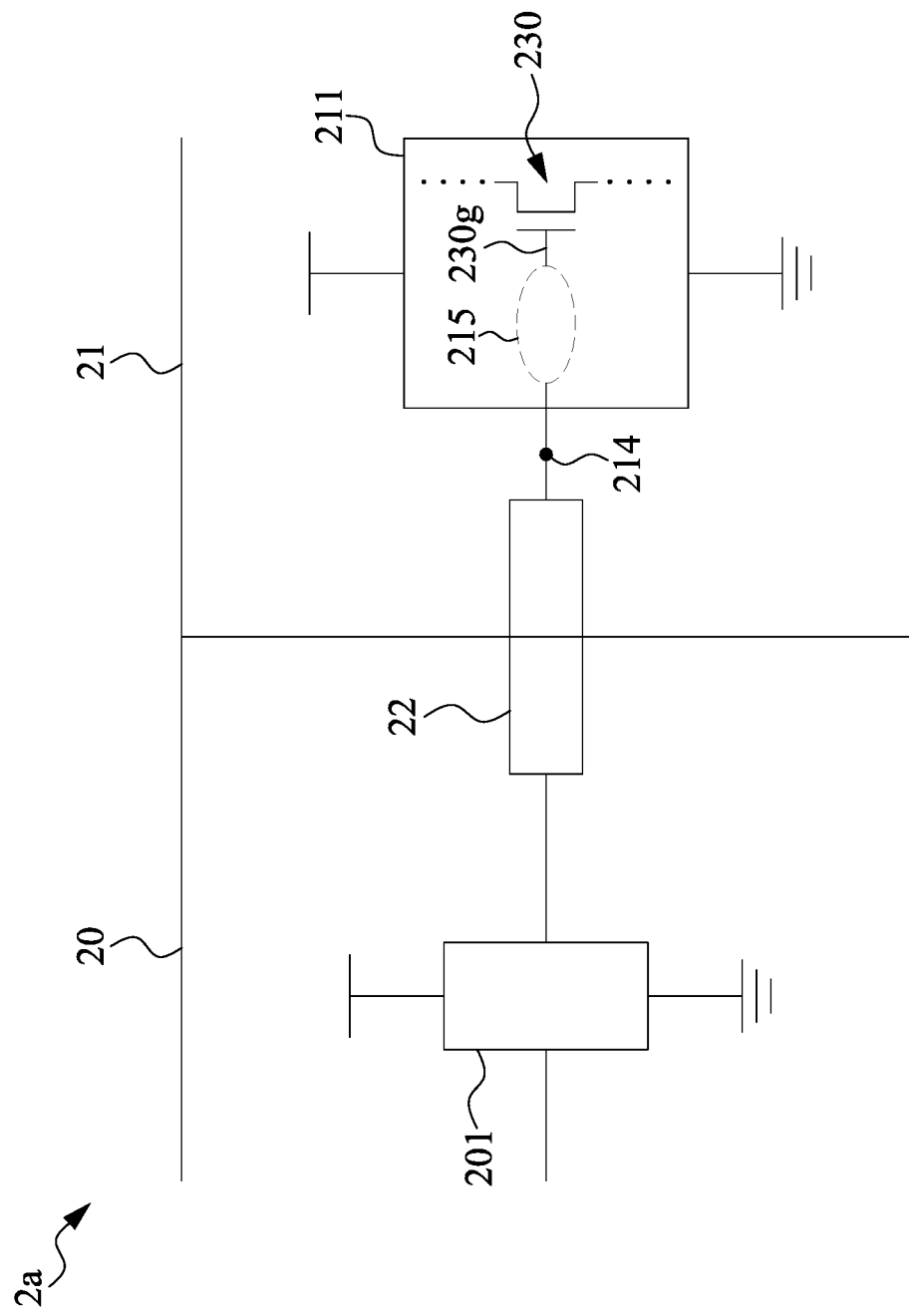
FIG. 2A is a schematic view of semiconductor arrangements in accordance with some embodiments of the present disclosure.

FIG. 2A illustrates an exemplary semiconductor arrangement (or semiconductor structure) 2a, which includes a first die 20, a second die 21 and a die-to-die interconnect 22 connecting a transmitter 201 of the die 20 to a receiver 211 of the die 21. The transmitter 201 may be a simple logic gate or an output circuit that includes two or more logic gates. The transmitter 201 may be a part of a standard cell, and may be itself a standard cell. The receiver 211 may be a simple logic gate or an input circuit that includes two or more logic gates. The receiver 211 may be a part of a standard cell, and may be itself a standard cell.

The receiver 211 in the die 21 includes a transistor 230; for clarity, other transistors that the receiver 211 may have are omitted and indicated in FIG. 2A as vertical ellipses.

To protect the gate 230*g* of the transistor 230 from the antenna effect (plasma-induced damage), a region 215 that does not include a direct, conductive path may be provided between the node 214 and the transistor 230*g*. That way, the charges accumulated on the die-to-die interconnect 22, if developed, would not flood to the gate 230*g*, thereby protecting the gate dielectric from PID.

The region 215 may include other circuit elements to allow electric signals to pass to the transistor 230. For example, the region 215 may include a semi-conductive path between the die-to-die interconnect 22 and the gate 230g of the transistor 230. The semi-conductive path in the region 215 may provide a more controlled path that can allow electric signals to pass through but not large amount of plasma-induced charges developed on the die-to-die interconnect 22.

In some embodiments, the semi-conductive path in the region 215 may be configured to be electrically conductive in response to a presence of a control voltage being greater than a threshold voltage; and the semi-conductive path in the region 215 may be configured to be electrically non-conductive in response to an absence of the control voltage being greater than the threshold voltage.

During the manufacturing of the constituent components of the semiconductor arrangement 2a, such as the die 20, the die 21, the die-to-die interconnect 22 and any parts thereof, no electrical signals is intentionally applied. Hence, the semi-conductive path in the region 215 may stay electrically non-conductive during the manufacturing of the semiconductor arrangement 2a. Hence, plasma-induced charges, even if developed on the die-to-die interconnect 22, would not suddenly be released freely to the gate 230g when the fabrication of electrical connection (such as depositing conductive interconnect in, e.g., BEOL portions of the die 21) between the die-to-die interconnect 22 and the receiver 211 is completed. After the completion of the manufacturing of and during the operation of the semiconductor arrangement 2a, electrical signals such as the control voltage mentioned in the previous paragraph may be applied to the region 215 to make the semi-conductive path therein electrically conductive, thereby allowing electrical signals to be communicated between the transmitter 201 of the die 20 and the receiver 211 of the die 21 via the die-to-die interconnect 22.

Figure 2B:
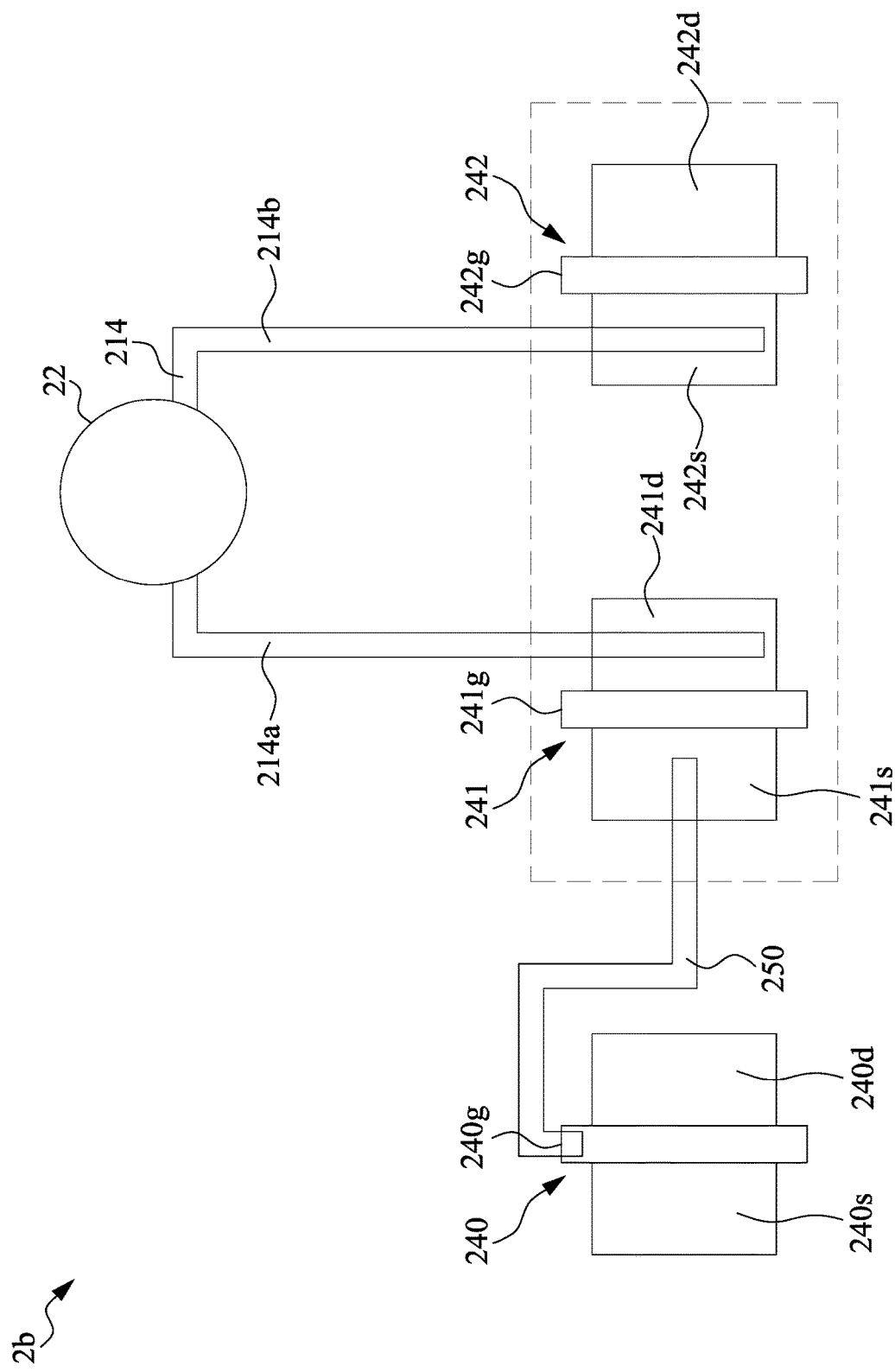
FIG. 2B is a top view of an exemplary semiconductor arrangement in accordance with some embodiments of the present disclosure.

FIG. 2B is a top view of an exemplary semiconductor arrangement 2b in accordance with some embodiments of the present disclosure. The semiconductor arrangement 2b includes a die-to-die interconnect 22 and a transistor 240 that is a part of a receiver, such as the receiver 211 of the die 21 in FIG. 2A.

The die-to-die interconnect 22 is not directly connected to the gate 240g of the transistor 240. That is, the node 214 is not directly connected to the gate 240g. Instead, the die-to-die interconnect 22 is connected to the gate 240g via a conductive (e.g., metallic) path 214a, the drain 241d of the transistor 241, the channel of the transistor 241 (below the gate 241g), the source 241s of the transistor 241 and a conductive (e.g., metallic) path 250. The path formed between the conductive paths 214a and 250 is semi-conductive because it is made of semiconductor materials. In some embodiments, during the fabrication of the semiconductor arrangement 2b, no voltage is intentionally applied to the gate 241g. Therefore, the channel of the transistor 241 may stay electrically non-conductive during fabrication. This may provide electrical isolation between the conductive path 214a and the conductive path 250. Such electrical isolation may protect, during fabrication, the dielectric materials (such as oxides) of the gate 240g from charges (such as plasma-induced charges) developed on the die-to-die interconnect 22 or other circuit structures connected thereto via a conductive path. After the complete fabrication of the semiconductor arrangement 2b, the semi-conductive path under the gate 241g may be turned on by the application of appropriate electrical signals to the gate 241g.

It is understood in the art that the source and drain of a transistor can be referred to as two source/drain regions of the transistor, because which is source and which is drain may be determined by the difference in voltages applied to the two source/drain regions.

Figure 3A:
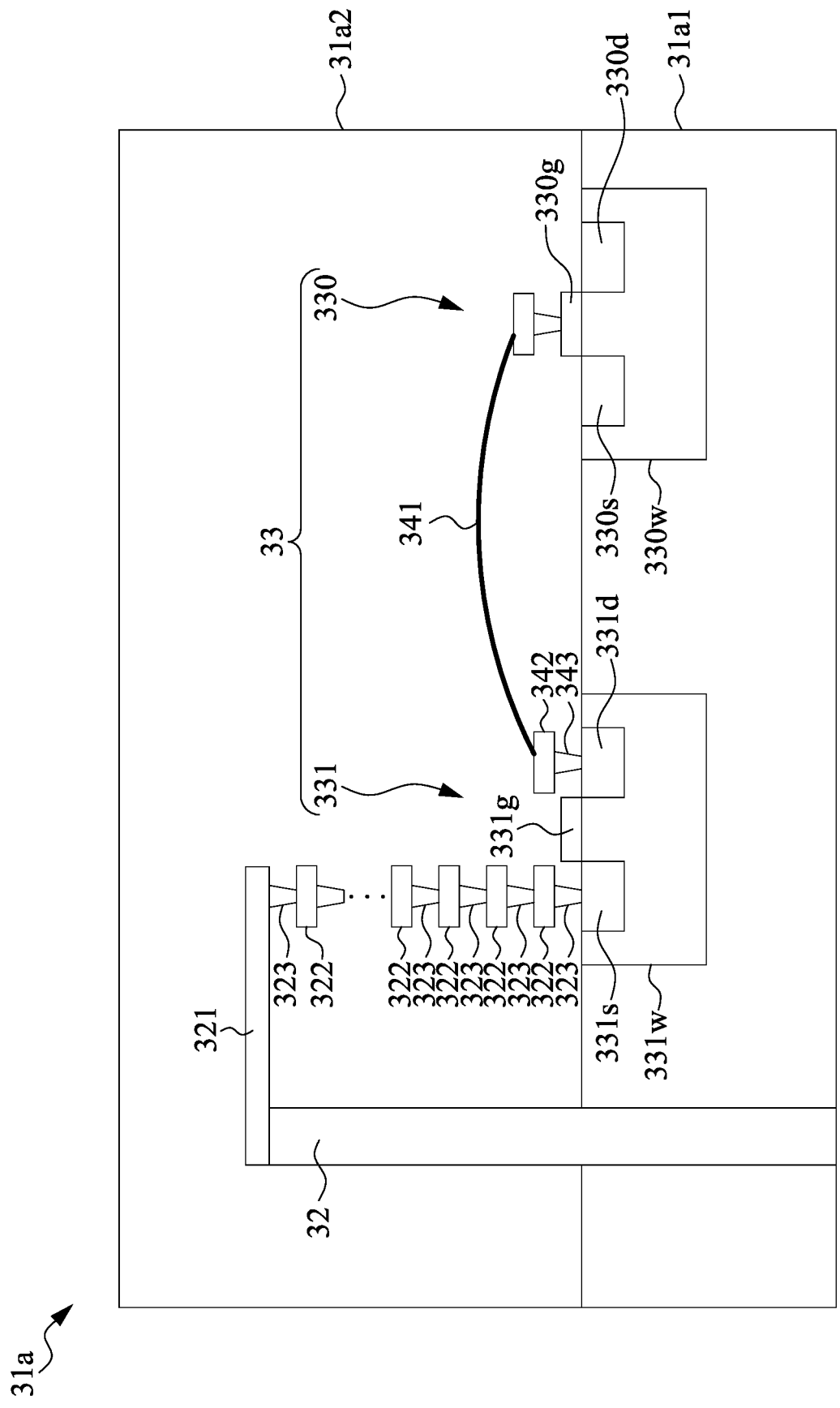
FIG. 3A is a cross-sectional view of an exemplary die in accordance with some embodiments of the present disclosure.

FIG. 3A is a cross-sectional view of an exemplary die 31a in accordance with some embodiments of the present disclosure. The die 31a includes a transistor 330 that may be a part of a receiver, such as the receiver 211 of the die 21 in FIG. 2A. A die-to-die interconnect 32, such as a TSV, may connect the die 31a to another die.

The die 31a includes a front-end-of-line (FEOL) portion 31a1 and a back-end-of-line (BEOL) portion 31a2. The FEOL portion 31a1 may include transistors, such as the transistor 330. The BEOL portion 31a2 may include conductive interconnects, such as metallic wires 321, 322 and vias 323.

The die 31a includes transistors 330 and 331, both having their respective gates 330g and 331g, drains 330d and 331d, and sources 330s and 331s. A gate dielectric is included in the gates 330g and 331g. The drains 330d, 331d and sources 330s, 331s may be formed in respective wells 330w, 331w of the transistors 330 and 331. The wells 330w, 331w may form or include the body of the transistors 330 and 331. As is known in the art, a channel may form under the gates 330g, 331g if appropriate voltages are applied to the gates 330g, 331g. Although not explicitly illustrated in FIG. 3A, body contacts may connected the body of the transistors 330, 331 to a reference voltage, such as ground.

In some embodiments, the drains 330d, 331d and sources 330s, 331s are n-doped; and the wells are p-doped. However, other types of doping are also possible.

The drain 331d of the transistor 331 is connected to the gate 330g of the transistor 330 via metallic connections 341, 342 and conductive vias 343. However, the die-to-die interconnect 32 is not directly connected to the gate 330g of the transistor 330 because at least the channel under the gate 331g of the transistor 331 is semi-conductive. Thus, the transistor 331 can be said to offer PID protection for the gate 330g of the transistor 330. The PID protection for the gate 330g may be considered as being offered during the fabrication of the die 31a, particularly during the fabrication of structural connection between the die-to-die interconnect 32 and the gate 330g (such as the die-to-die interconnect 32 itself, the metallic wires 321, 322, the vias 323, the metallic connections 341, 342, and the conductive vias 343), because no electrically conductive path would be present between the die-to-die interconnect 32 and the gate 330g. After the fabrication is completed, a voltage greater than the threshold voltage of the transistor 331 may be applied to the gate 331g to allow electrical signals communicate between the die-to-die interconnect 32 and the gate 330g.

The transistors 330, 331 may be viewed as forming a composite input circuitry 33 for the die 31a.

Figure 3B:
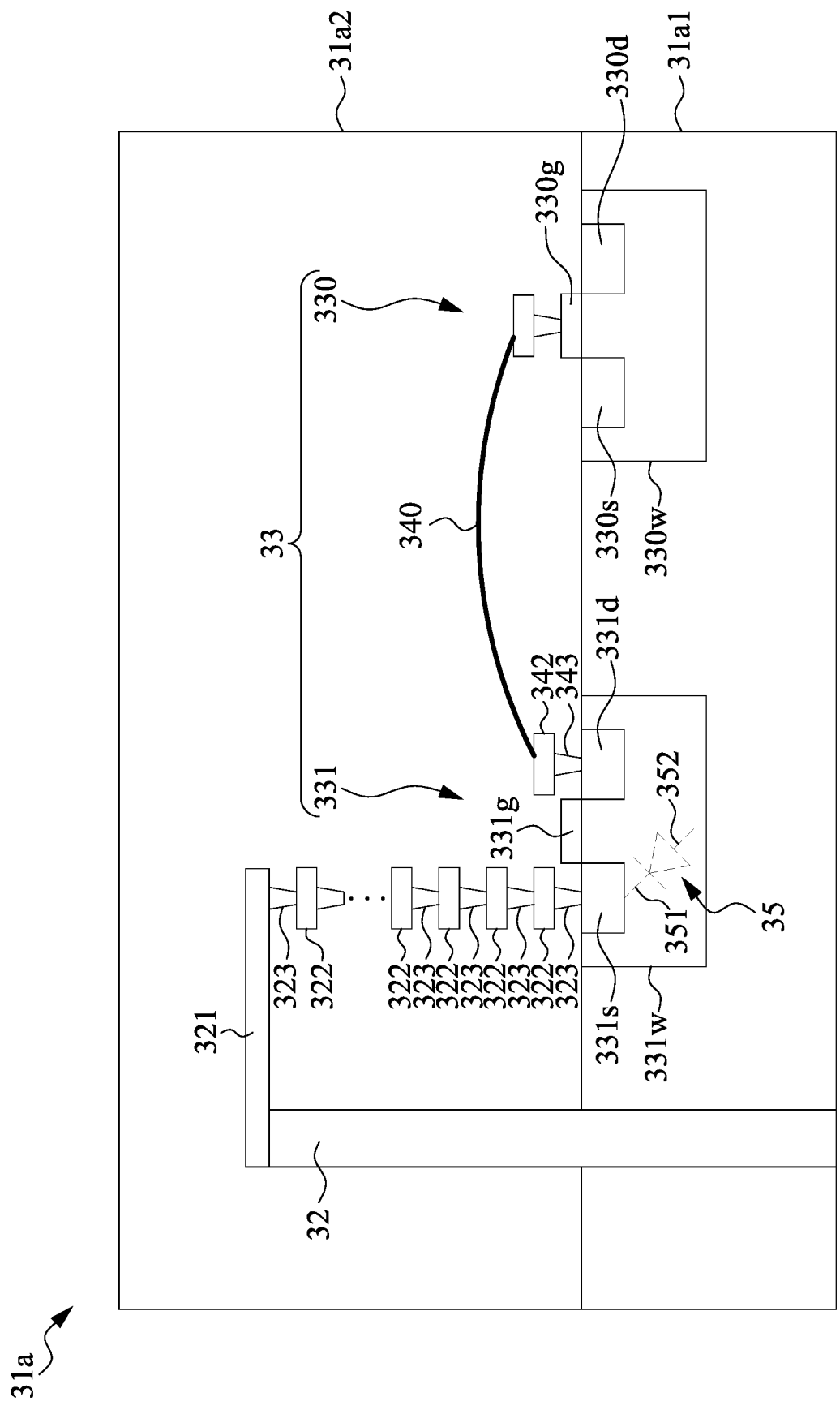
FIG. 3B is a cross-sectional view of an exemplary die in accordance with some embodiments of the present disclosure.

FIG. 3B illustrates another aspect of the PID protection capability that can be offered to the gate dielectrics of the transistor 330.

The source 331s (and also drain 331d) of the transistor 331 may be doped with a polarity different from the polarity that the well 331w is doped with. Hence, the transistor 331 may be seen as providing an effective p-n junction 35 between the source 331s and the well 331w. The effective p-n junction 35 may be considered as having a first end 351 and a second end 352. Because the well 331w may be connected to a reference voltage via a body contact (not explicitly illustrated), the effective p-n junction 35 may also be considered as providing a discharge path from the source 331s to the reference voltage.

The effective p-n junction 35 may also be considered as being connected in parallel with the semi-conductive path that exists between the vias 323 and 343 and is formed of the source 331s, the channel under the gate 331g and the drain 331d of the transistor 331. If a large electric potential develops on the die-to-die interconnect 32 (e.g., induced by plasma-based processing), then the effective p-n junction 35 may provide a discharge path, thereby contributing to the avoidance of the large potential hitting the gate dielectric of the transistor 330 that may otherwise break down the gate dielectric.

In short, the transistor 331 and its configuration can help protecting the gate dielectric of the transistor 330 from breaking down by providing a semi-conductive path between the die-to-die interconnect 32 and the gate 330g (which prevents a large quantity of charges from flowing to the gate dielectric unhindered over a, say, metallic path) and providing the effective p-n junction 35 (which provides a discharge path).

Another advantage is that transistors can be fabricated at a small size with modern manufacturing processes. Hence, the transistor 331 may be more advantageous in providing PID protection than antenna diodes, whose size may be large based on applicable design rules.

Figure 3C:
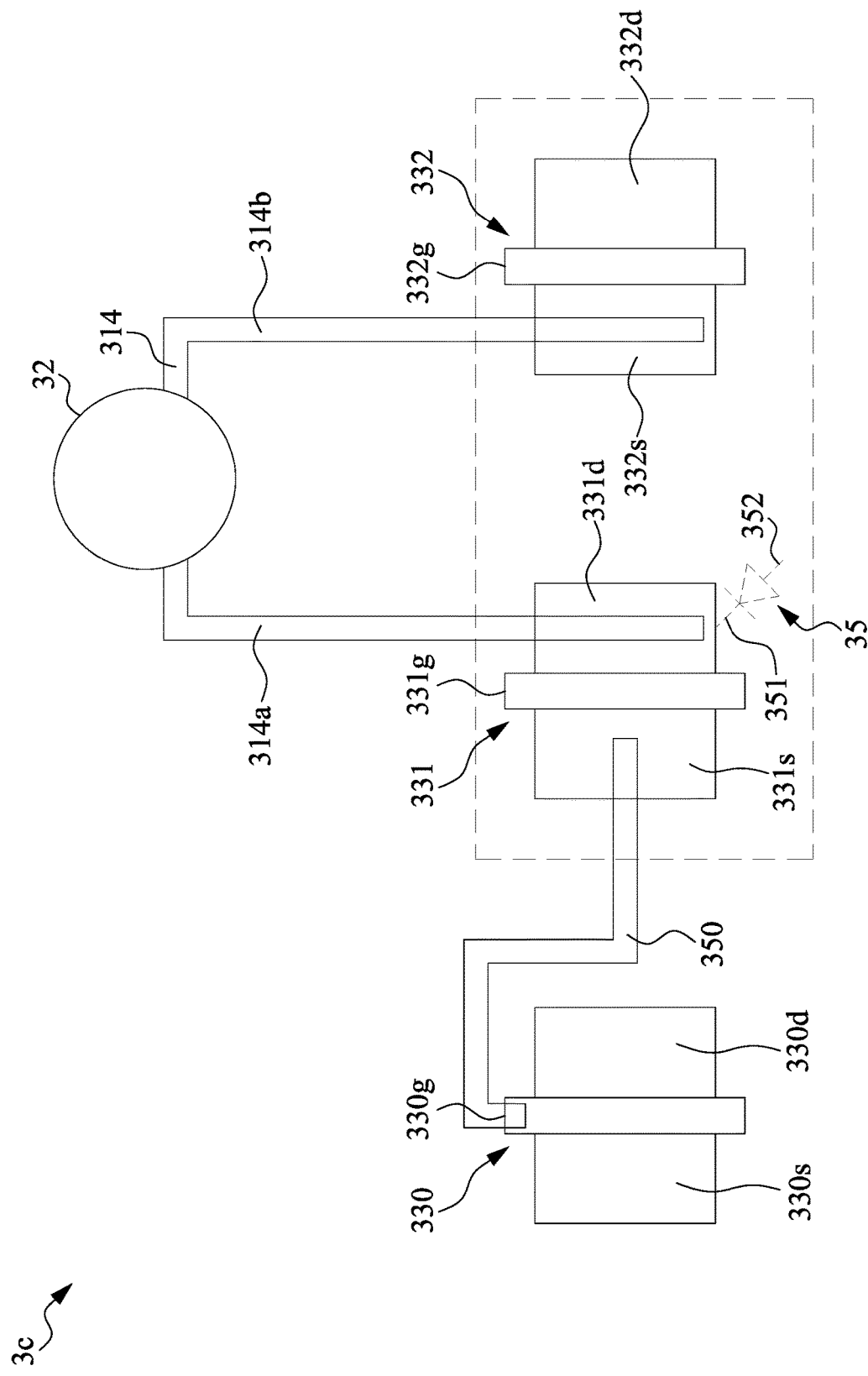
FIG. 3C is a top view of an exemplary semiconductor arrangement in accordance with some embodiments of the present disclosure.

FIG. 3C is similar to FIG. 2B, with a difference being that an effective p-n junction 35 is explicitly illustrated. The gate dielectric of the gate 330g of the transistor 330 may be protected by the semi-conductive path (that may stay electrically non-conductive during the fabrication of the semiconductor arrangement 3c by virtue of the absence at the gate 331g of a voltage greater than the threshold voltage of the transistor 331) between the conductive paths 314a and 350, as well as by the effective p-n junction 35 that can help create a discharge path for charges that may come from the die-to-die interconnect 32 through the conductive path 314a during fabrication.

In an embodiment, the die 31a may additionally include another transistor with its own gate region, first source/drain region and second source/drain region, wherein said another transistor is connected between the die-to-die interconnect 32 and the gate terminal 330g. In such an embodiment, one of the transistor 331 and said another transistor is PMOS while the other is NMOS, whereby the two transistors form a CMOS transmission gate.

In an embodiment, no conductive path directly connects the die-to-die interconnect 32 to the gate region 330g of the transistor 330.

Figure 4A:
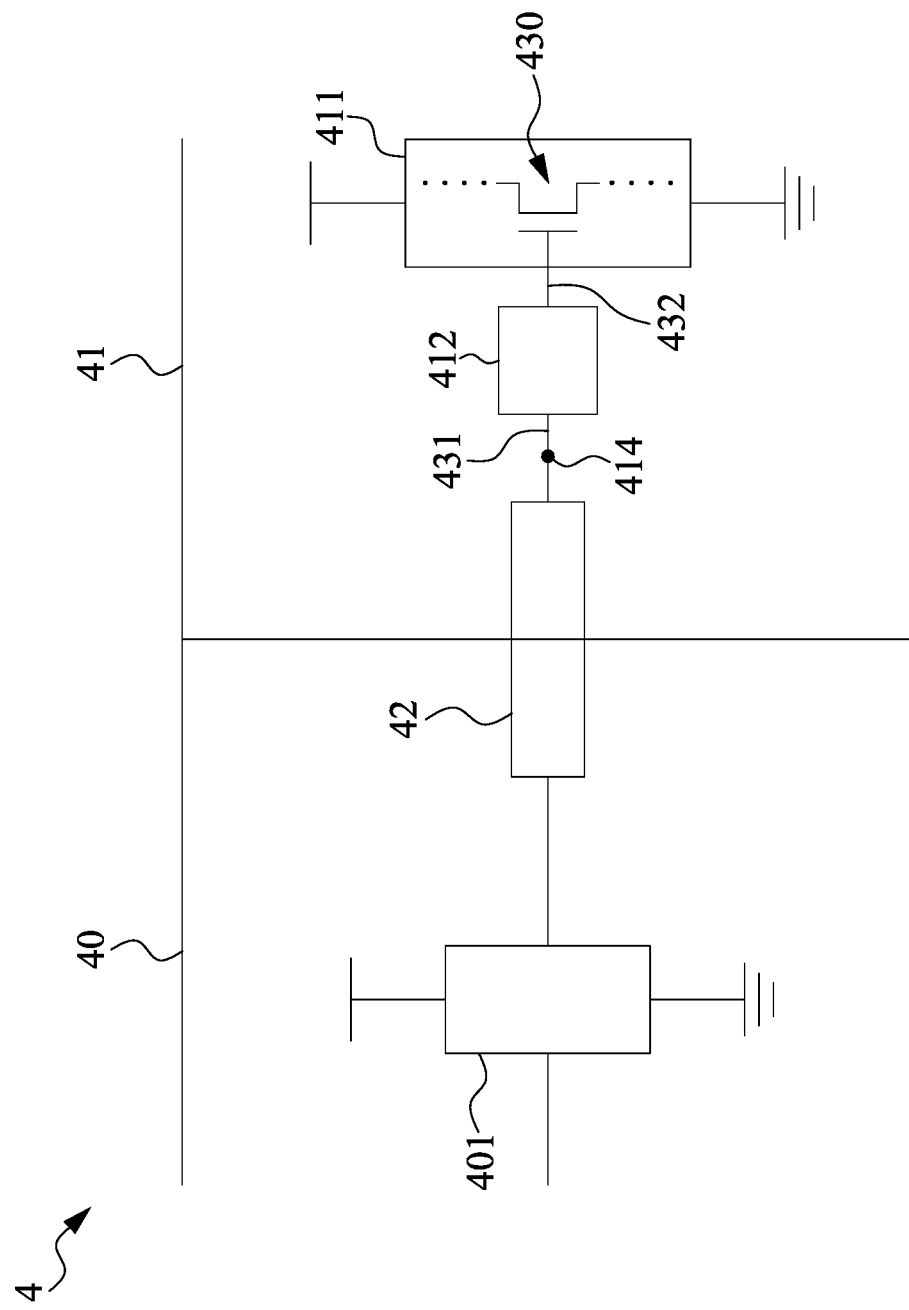
FIG. 4A is a schematic view of semiconductor arrangements in accordance with some embodiments of the present disclosure.

FIG. 4A illustrates an exemplary semiconductor arrangement (or semiconductor structure) 4, in accordance with some embodiments of the present disclosure.

The semiconductor arrangement 4 includes a first die 40, a second die 41 and a die-to-die interconnect 42 connecting a transmitter 401 of the die 40 to a receiver 411 of the die 41. The transmitter 401 may include an output logic gate. The receiver 411 may include an input transistor 430. The receiver 411 may include an input logic gate that includes an input transistor 430.

The die 41 includes a circuit 412 that has a first terminal 431 and a second terminal 432. The circuit 412 may provide PID protection to the transistor 430 by providing a semi-conductive path between the die-to-die interconnect 42 and the gate of the transistor 430. The circuit 412 may also provide effective p-n junction for discharging charges accumulated on the die-to-die interconnect 42.

Figure 4B:
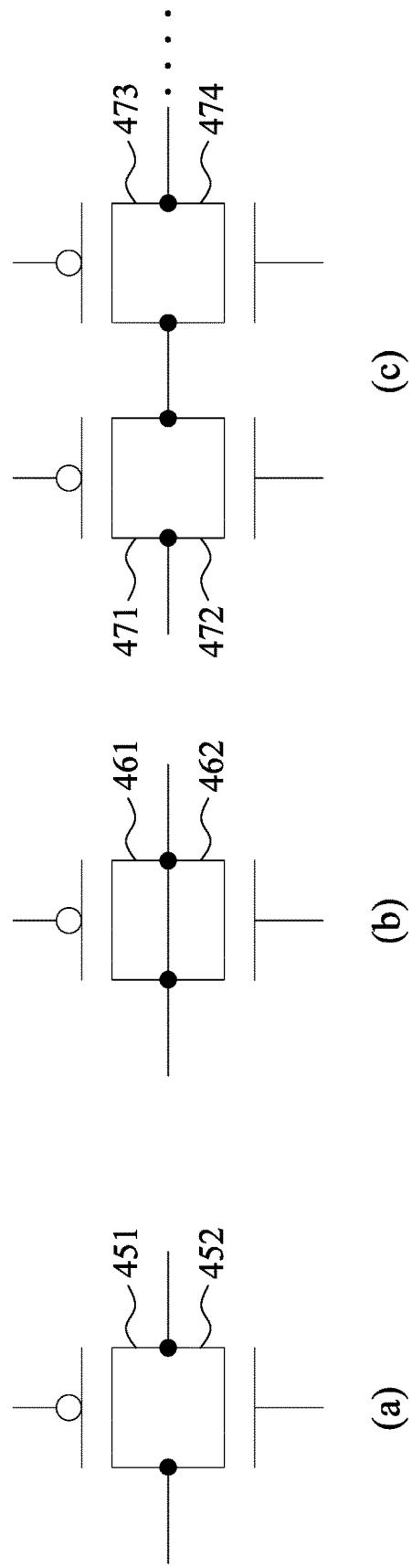
FIG. 4B illustrates several circuits in accordance with some embodiments of the present disclosure.
Figure 4B:
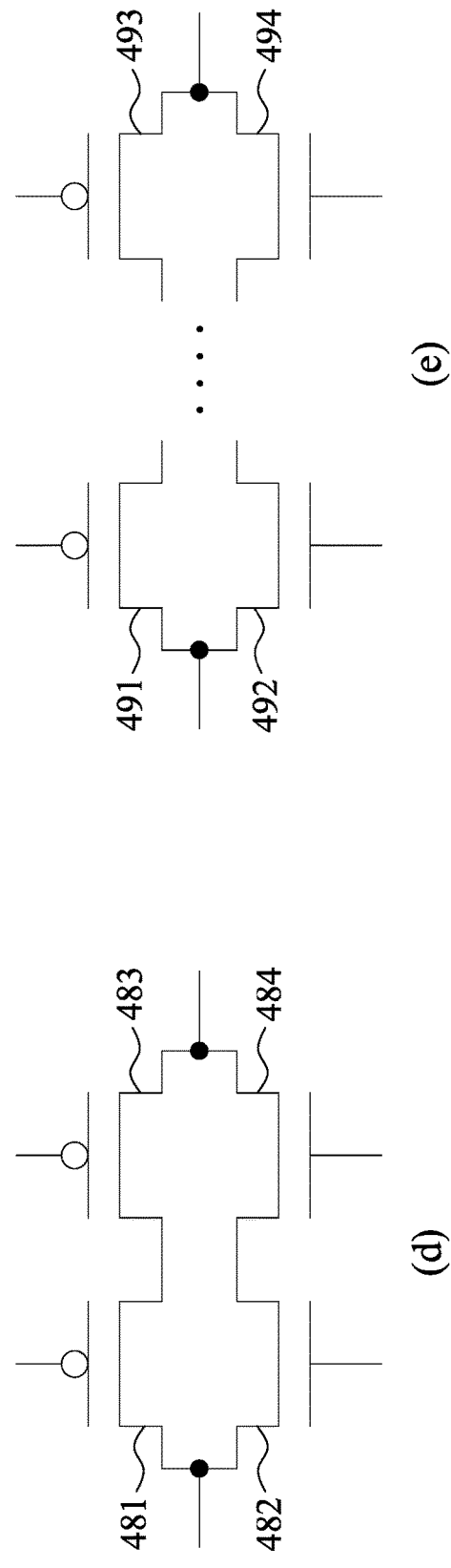

FIG. 4B illustrates several exemplary embodiments that may implement the circuit 412.

In FIG. 4B, part (a) illustrates a transmission gate that is formed by a p-type transistor 451 and an n-type transistor 452. The transmission gate provides a controllable semi-conductive path between the terminals 431 and 432 of the circuit 412. The path between the terminals 431 and 432 may stay electrically non-conductive in the absence of sufficient voltages applied to the gate terminals of the transistors 451 and 452 (such as during the fabrication of the semiconductor arrangement 4); said path may become electrically conductive by turning on the transistors 451 and 452. The source/drain regions of these transistors may also provide effective p-n junction, in conjunction with the body regions of the transistors. Part (b) illustrates a transmission gate that is formed by a p-type transistor 461 and an n-type transistor 462, where one source/drain region of the transistors is directly connected to the other source/drain region.

In FIG. 4B, part (c) illustrates an embodiment that includes two transmission gates connected in series, including the transistors 471, 472, 473 and 474.

In FIG. 4B, part (d) illustrates an embodiment in which PMOS transistors 481, 483 are connected in parallel with NMOS transistors 482, 484 with one source/drain region of the PMOS transistors not connected to the source/drain region of the NMOS transistors. Part (e) differs from part (d) in that the PMOS and NMOS branches may each include more than two transistors.

The gate terminals of the transistors of the circuitry shown in FIG. 4B may be controlled by other logic to provide flexible or programmable control of these transistors. The gate terminals of these transistors may, e.g., after fabrication and during circuit operation, also be connected to reference voltages, such as ground, positive power supply and negative power supply.

Figure 5A:
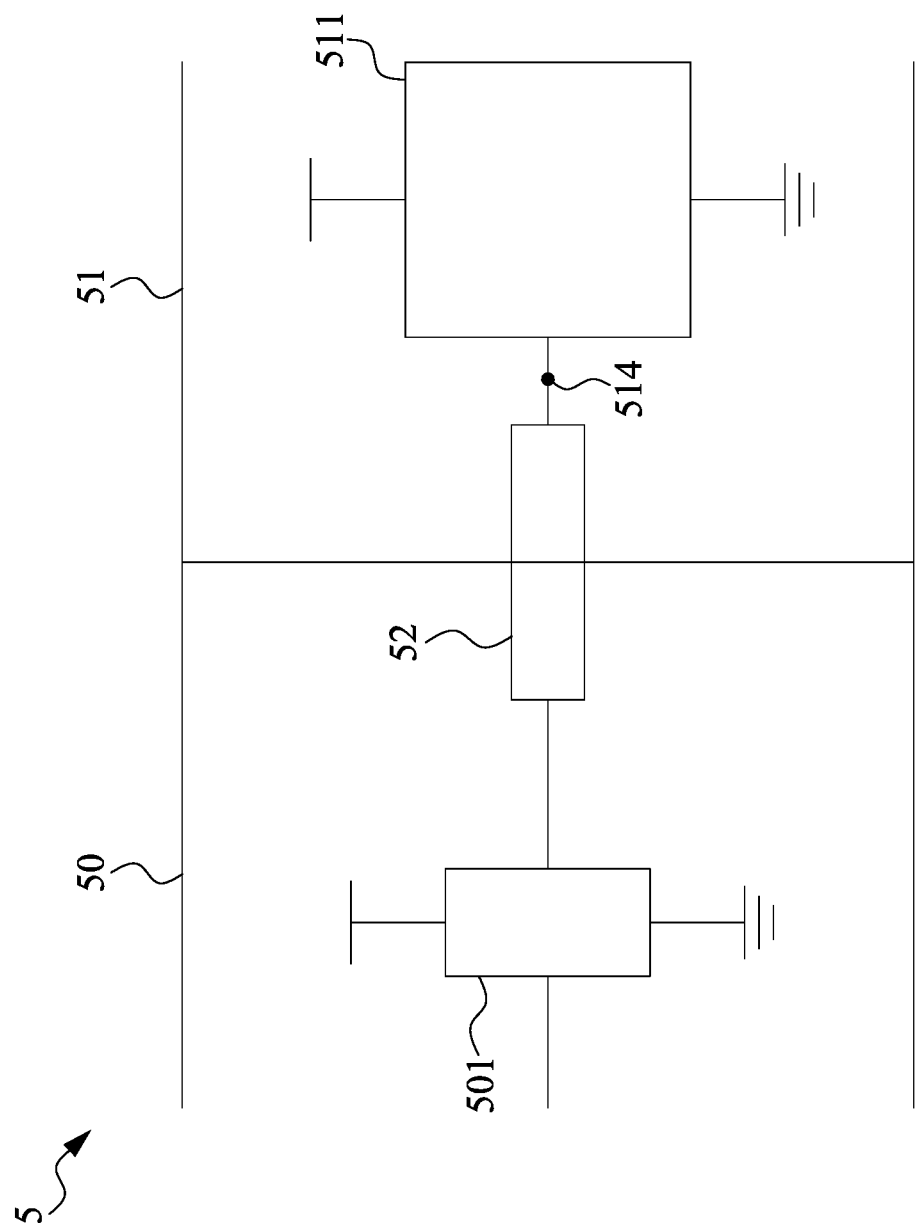
FIG. 5A is a schematic view of semiconductor arrangements in accordance with some embodiments of the present disclosure.

PID protection capability may also integrated in the design of the circuitry of a receiver, as shown in the embodiment of FIG. 5A, which illustrates an exemplary semiconductor arrangement (or semiconductor structure) 5, in accordance with some embodiments of the present disclosure.

Similar to the semiconductor arrangement 4 in FIG. 4A, the semiconductor arrangement 5 in FIG. 5A includes a first die 50, a second die 51 and a die-to-die interconnect 52 connecting a transmitter 501 of the die 50 to a receiver 511 of the die 51.

Unlike the semiconductor arrangement 4 in FIG. 4A, the PID protection capability is integrated in the design of the receiver 511 of the die 51, with more details explained with reference to FIG. 5B, which illustrate several embodiments of the receiver 511.

Figure 5B:
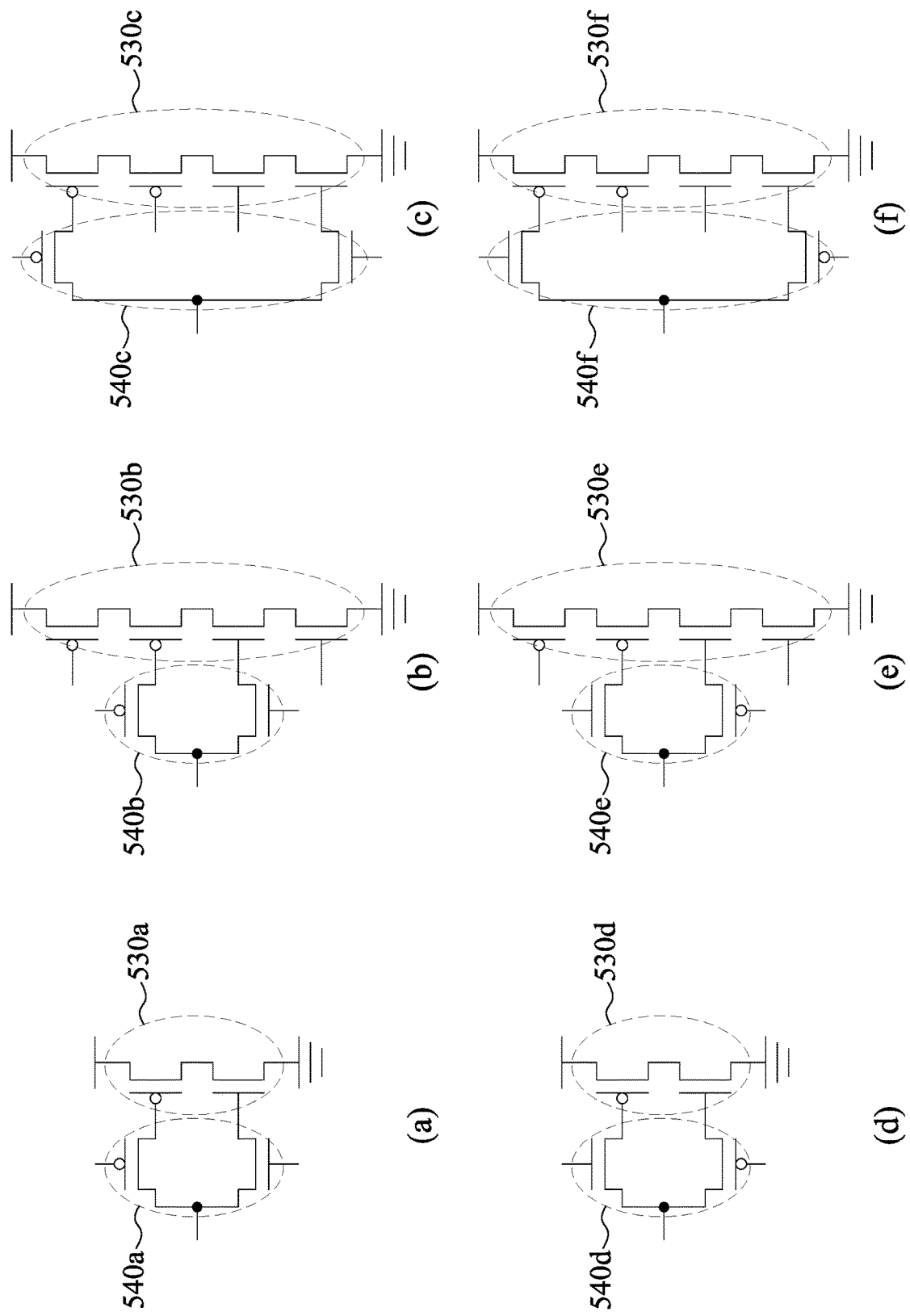
FIG. 5B illustrates several circuits in accordance with some embodiments of the present disclosure.

Take part (a) of FIG. 5B as an example. The receiver 511 so implemented may include a logic gate 530a and a passing circuit 540a. The passing circuit 540a provides a semi-conductive path from the die-to-die interconnect to the gate dielectrics of the logic gate 530a, without providing a conductive (or metallic) path to these gate dielectrics. The absence of conductive path to these gate dielectrics may protect them from PID during the fabrication of the semiconductor arrangement 5. The transistors in the passing circuit 540a may also provide effective p-n junctions connected to the node 514.

Parts (b), (c), (d), (e) and (f) in FIG. 5B illustrate other examples of logic gates 530b, 530c, 530d, 530e and 530f, and passing circuits 540b, 540c, 540d, 540e and 540f.

Figure 6A:
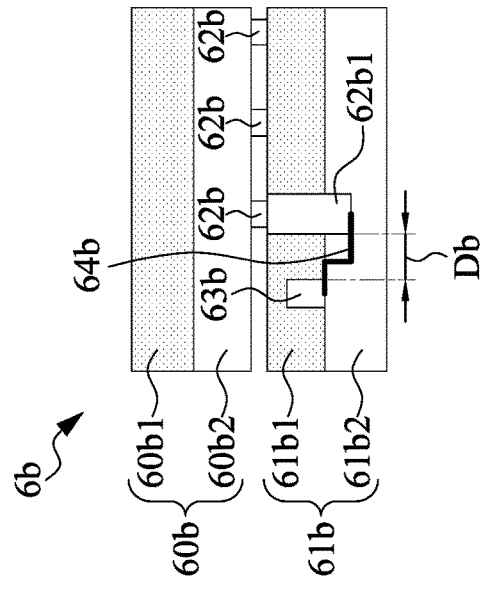
FIGS. 6A-6C are cross-sectional views of exemplary semiconductor arrangements in accordance with some embodiments of the present disclosure.
Figure 6B:
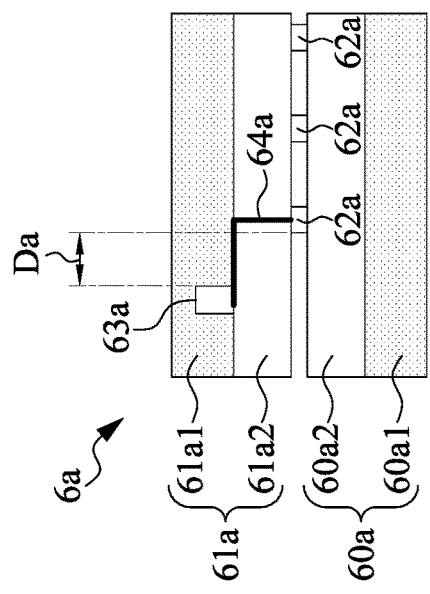
Figure 6C:
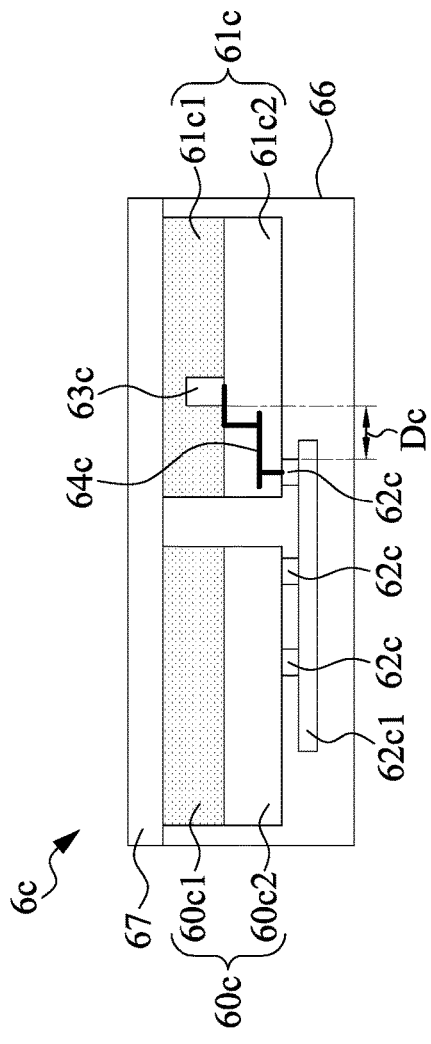

FIGS. 6A-6C are cross-sectional views of exemplary semiconductor arrangements 6a, 6b, 6c in accordance with some embodiments of the present disclosure.

Refer to FIG. 6A. The semiconductor arrangement 6a includes a first die 60a, a second die 61a, and die-to-die interconnects 62a connecting the dies 60a and 61a to each other. Each of the dies 60a, 61a includes respective front-end-of-line (FEOL) portions 60a1, 61a1, and respective back-end-of-line (BEOL) portions 60a2, 61a2. The FEOL portions 60a1, 61a1 may include transistors. The BEOL portions 60a2, 61a2 may include conductive paths, such as a conductive interconnect 64a.

The die 61a includes a composite receiver 63a, which may include a logic gate and a passing circuit in a manner similar to the receiver 511 and its various embodiments shown in FIG. 5B. The passing circuit can help provide PID protection to the gate dielectric of the input transistor of the logic gate in case a large potential develops in the die-to-die interconnects 62a during, e.g., fabrication of the semiconductor arrangement 6a.

During the fabrication of the die 61a, the FEOL portion 61a1 may be fabricated before the BEOL portion 61a2. Hence, the composite receiver 63a (which may include transistors) may be fabricated before the die-to-die interconnects 62a and the conductive interconnect 64a in the BEOL portion 61a2. Hence, the passing circuit in the composite receiver 63a may provide PID protection to the gate dielectric of the input transistor of the logic gate in the composite receiver 63a if electrical charges develop during the fabrication of the die-to-die interconnects 62a and/or the conductive interconnect 64a.

The FEOL portion 61a1 may be fabricated on a substrate, such as a semiconductor substrate. A distance $D_a$ between the die-to-die interconnect 62a and the composite receiver 63a in a direction perpendicular to the substrate is greater than or equal to about 0.1 micrometer and less than or equal to about 100 micrometers.

The semiconductor arrangement 6b in FIG. 6B is similar to the semiconductor arrangement 6a in FIG. 6A. A difference is that the composite receiver 63b is connected to the die 61b via not only the die-to-die interconnect 62b but also a TSV 62b1. By virtue of the passing circuit in the composite receiver 63b, plasma-induced charges developed during the fabrication of the TSB 62b1 may be less likely to break the gate dielectrics of the transistors of the input logic gate in the composite receiver 63b. A distance Db between the TSV 62b1 and the composite receiver 63b in a direction perpendicular to the substrate is greater than or equal to about 0.1 micrometer and less than or equal to about 100 micrometers.

Refer to FIG. 6C, which illustrates an exemplary semiconductor arrangement 6c with a die 60c and a die 61c assembled in the same package. The dies 60c, 61c are attached to a package substrate 67 and encapsulated by encapsulation material 66. A distance $D_c$ between the die-to-die interconnect 62c and the composite receiver 63c in a direction perpendicular to the substrate is greater than or equal to about 0.1 micrometer and less than or equal to about 100 micrometers.

FIGS. 7A-7D are cross-sectional views of exemplary semiconductor packages in accordance with some embodiments of the present disclosure.

Figure 7A:
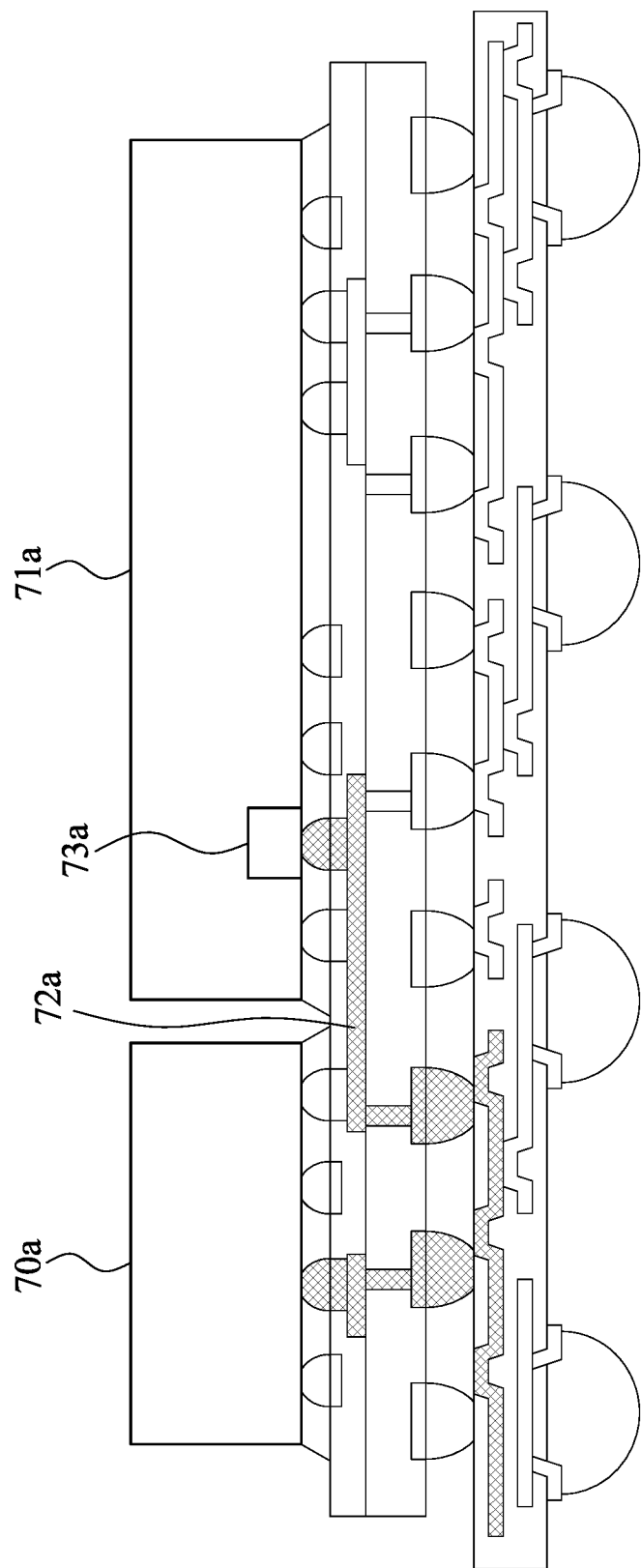
FIGS. 7A-7D are cross-sectional views of exemplary semiconductor packages in accordance with some embodiments of the present disclosure.

FIG. 7A illustrates a chip-on-wafer-on-substrate (CoWoS) package that includes two dies 70a, 71a. The die 71a includes a composite receiver 73a that may include a logic gate and a passing circuit in a manner similar that may be to the receiver 511 and its various embodiments shown in FIG. 5B.

The composite receiver 73a is connected to the die 70a via a die-to-die interconnect 72a. In the embodiment of FIG. 7A, the die-to-die interconnect 72a includes bumps, horizontal and vertical wires in the interposer substrate directly below the dies 70a, 71a, and conductive wires in the package substrate that is below the interposer substrate. The composite receiver 73a includes a passing circuit that can help protect the gate dielectrics of the input logic gate of the composite receiver 73a from PID damage if a large potential develops in the die-to-die interconnect 72a.

Figure 7B:
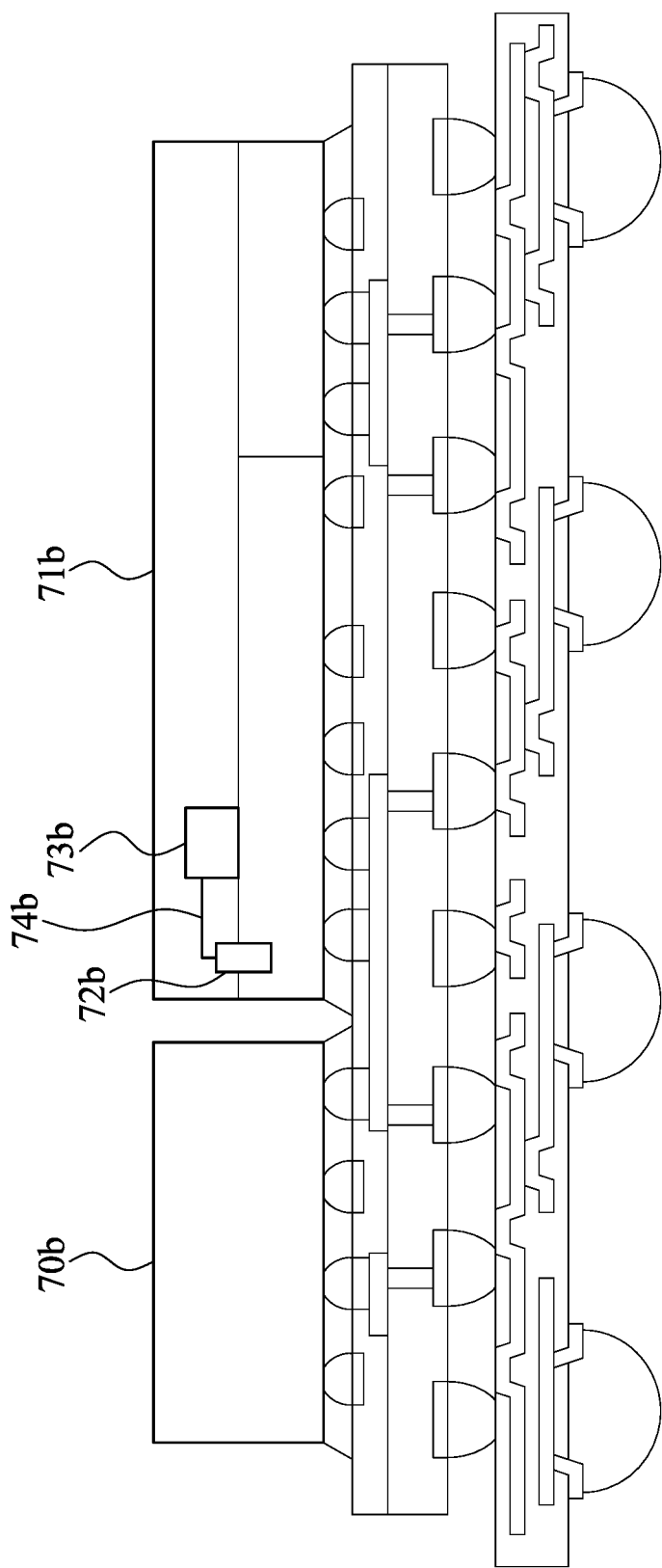

FIG. 7B illustrates a CoWoS package similar to that shown in FIG. 7A. A difference is that the die 71b may be a system-on-integrated-chip (SoIC) that includes several component dies (three are illustrated in the embodiment of FIG. 7B). The composite receiver 73b may be connected to the die 70b via, in addition to the wiring external to the dies (as shown in FIG. 7A), a TSV 72b and an in-die conductive wire 74b.

Figure 7C:
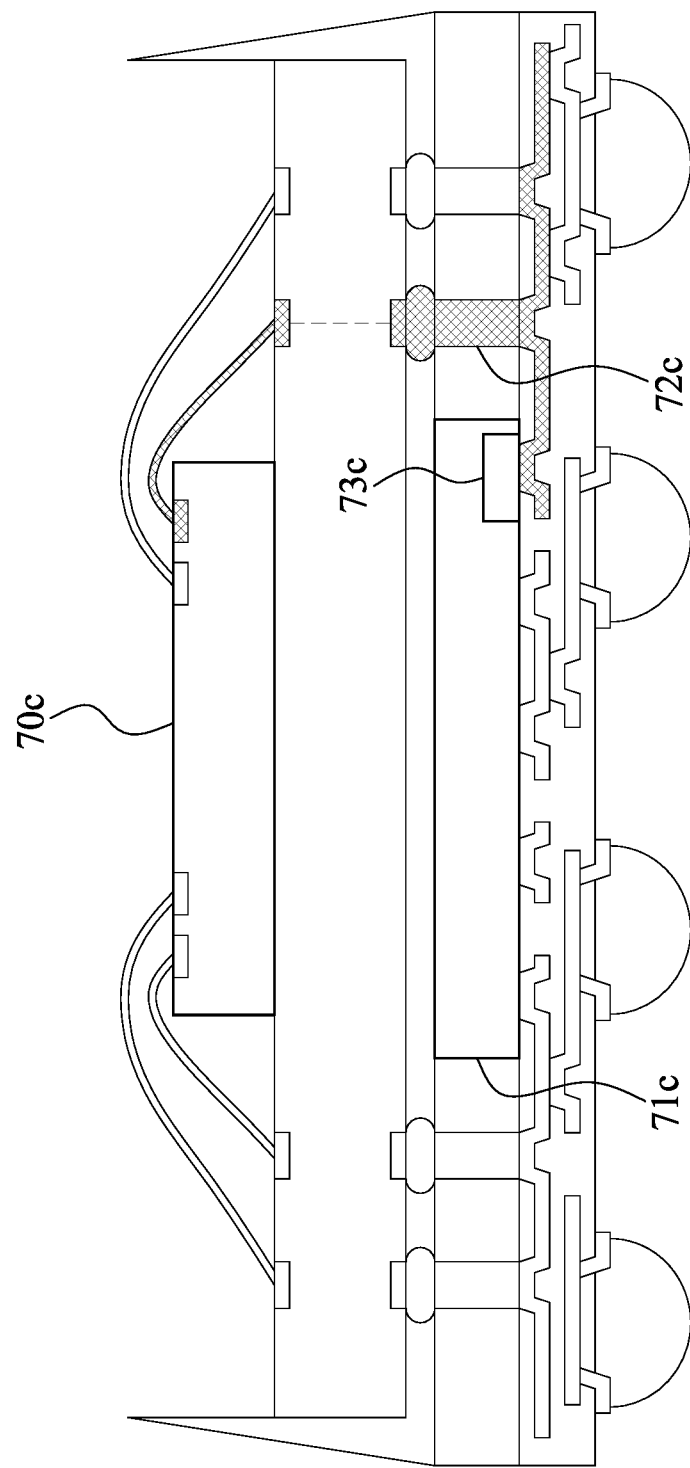

FIG. 7C illustrates an integrated fan-out (InFO) package that includes two dies 70c, 71c. The composite receiver 73c in the die 71c is connected to the die 70c via a die-to-die interconnect 72c that may include bumps, horizontal and vertical wires in the package substrates supporting the dies 70c, 71c, and the bond wire connected to the die 70c.

Figure 7D:
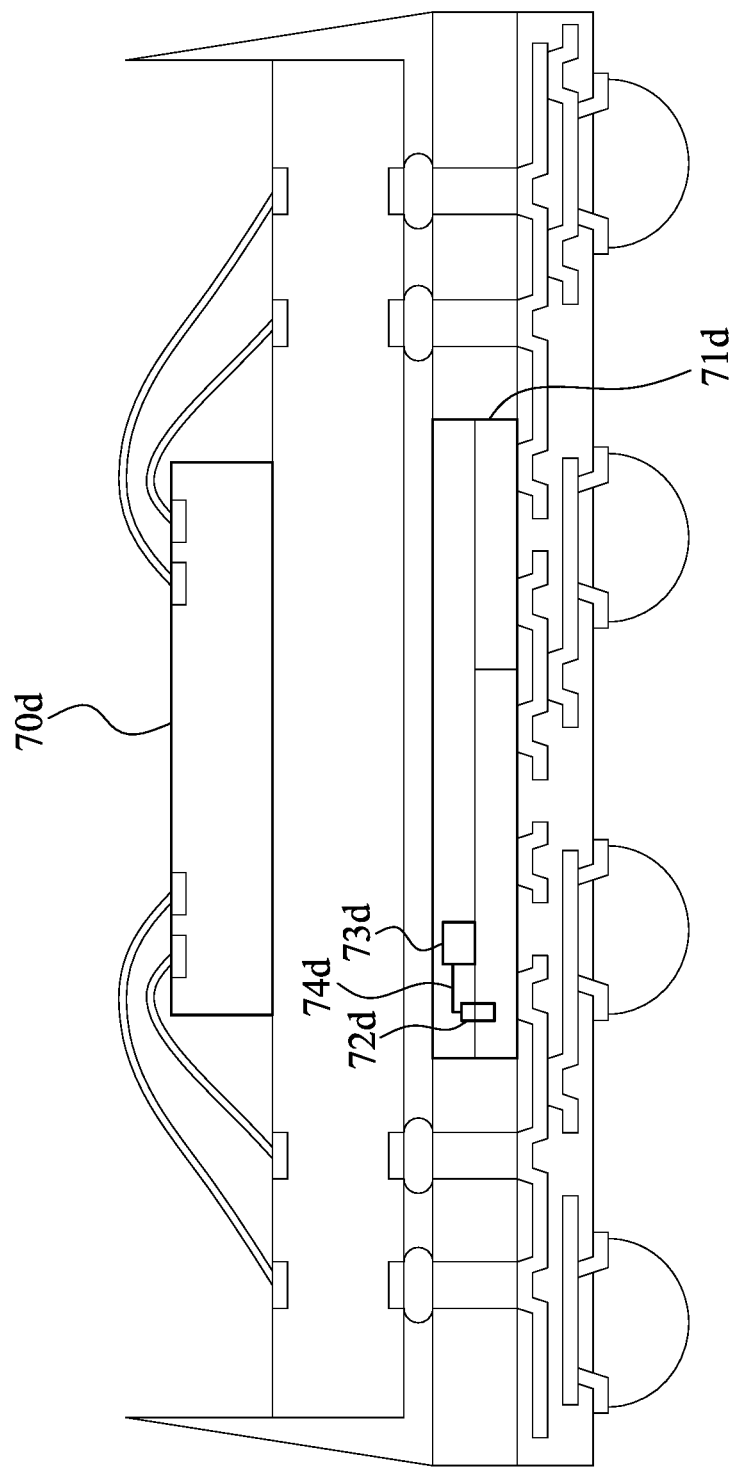

FIG. 7D illustrates an InFO package similar to that shown in FIG. 7C. A difference is that the die 71d may be a system-on-integrated-chip (SoIC) that includes several component dies (three are illustrated in the embodiment of FIG. 7D), in a manner that can be similar to the configuration of the die 71b in FIG. 7B.

Figure 8A:
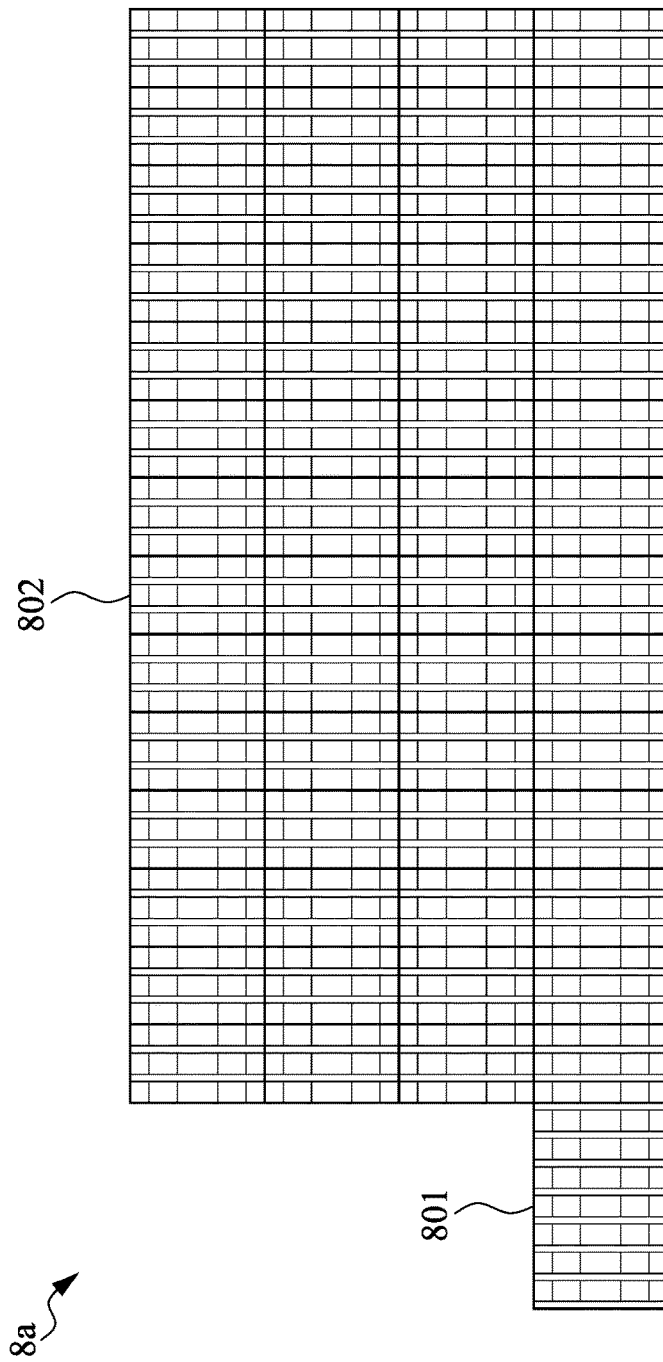
FIG. 8A illustrates the layout area of a portion of a die in accordance with a comparative embodiment.
Figure 8B:
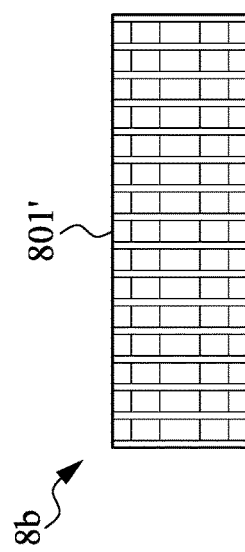
FIG. 8B illustrates the layout area of a portion of a die in accordance with some embodiments of the present disclosure.

FIG. 8A illustrates the layout area of a portion of a die in accordance with a comparative embodiment. FIG. 8B illustrates the layout area of a portion of a die in accordance with some embodiments of the present disclosure.

Specifically, the die area 8a includes a portion 801 that represents a receiver (e.g., input logic gate) and a portion 802 that represents the antenna diodes for providing PID protection to the receiver portion 801. In the comparative embodiment of FIG. 8A, the die-to-die interconnection may be directly connected to the gate oxide of the input transistor; in such a comparative embodiment, antenna diodes that have an area satisfying associated design rules may be used to provide PID protection.

In contrast, the die area 8b includes a portion 801' that represents a composite receiver (e.g., a passing circuit and an input logic gate) that can also provide PID protection to the input logic gate, in a manner similar to the embodiment of FIGS. 3A-5B, without using antenna diodes. FIG. 8B shows the benefit in area reduction that the embodiment of using a composite receiver can offer over the comparative embodiment of using antenna diodes.

FIG. 8C illustrates exemplary performance metrics related to some embodiments of the present disclosure.

In FIG. 8C, "Embodiment A" refers to the antenna-diode embodiment, whereas "Embodiment B" refers to the composite-receiver embodiment. The table in FIG. 8C shows advantages in area reduction, timing performance, power saving and speed of the composite-receiver embodiment.

Figure 9A:
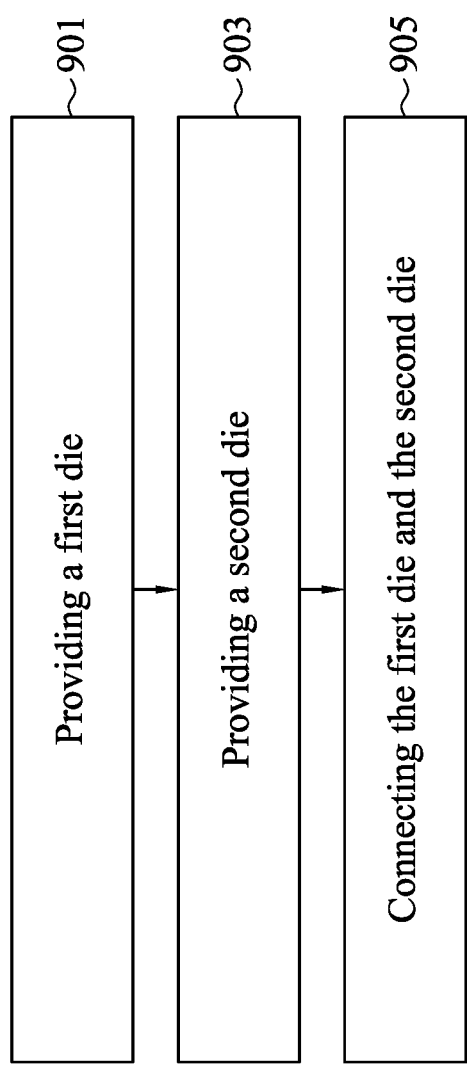
FIGS. 9A-9C show exemplary method flowcharts, in accordance with at least one embodiment of the present disclosure.
Figure 9B:
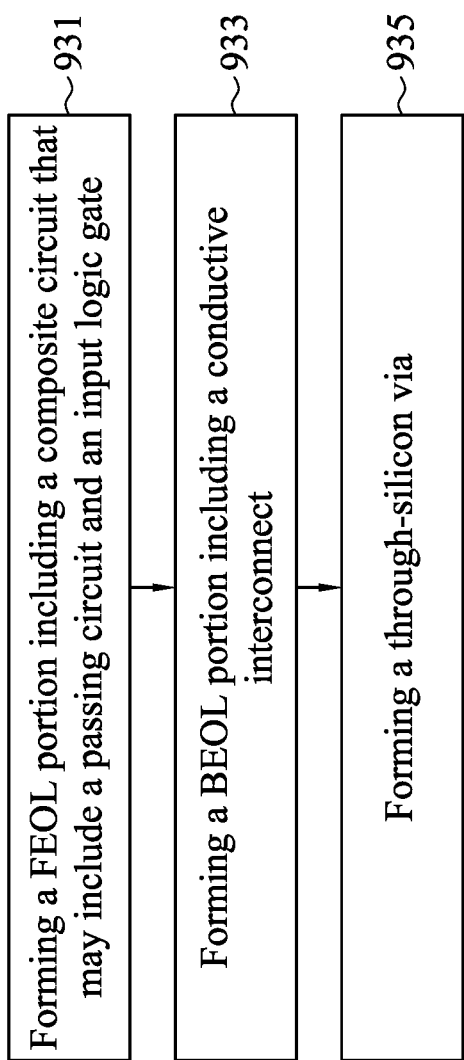
Figure 9C:
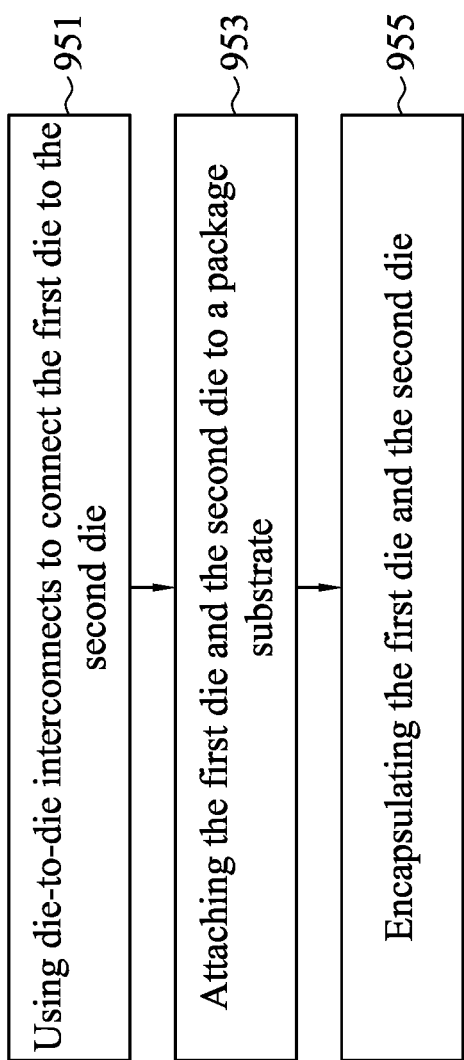

FIGS. 9A-9C show exemplary method flowcharts for making a semiconductor arrangement, in accordance with at least one embodiment of the present disclosure.

Refer to FIG. 9A. At step 901, a first die is provided. The first die may be physically fabricated or acquired by other methods, such as being purchased from a third party. The first die may include an output logic gate. The first die may include a FEOL portion and a BEOL portion similar to the die 60a shown in FIG. 6A. The output logic gate of the first die may reside in the FEOL portion.

At step 903, a second die area is provided. The second die may be physically fabricated or acquired by other methods, such as being purchased from a third party. The second die may include an input logic gate. The second die may include a FEOL portion and a BEOL portion similar to the die 61*a* shown in FIG. 6A. The input logic gate of the second die may reside in the FEOL portion. More details about the step 903 will be discussed with reference to FIG. 9B.

At step 905, the first die and the second die are connected. The connection may be made via a die-to-die interconnect. The first die and the second die may form a multi-chip package. More details about the step 905 will be discussed with reference to FIG. 9C.

It is noted that the sequence shown in FIG. 9A is exemplary and non-limiting. For example, the second die may be provided before the first die.

Refer to FIG. 9B. At step 931, a FEOL portion may be formed in the second die. The FEOL portion may include a composite circuit similar to the composite receiver 63*a* shown in FIG. 6A. The composite circuit may include a passing circuit and an input logic gate. The input logic gate may include a transistor. The passing circuit may include a PMOS transistor and an NMOS transistor. The passing circuit may be connected to a gate region of the transistor. The passing circuit, after its formation, may protect the input logic gate from plasma-induced damages that may be associated with subsequent fabrication steps, such as the connection of the first die and the second die described in step 905. The protection mechanism may be similar to the embodiments discussed with reference to FIGS. 2A-5B.

At step 933, a BEOL portion may be formed in the second die. The BEOL portion may include a conductive interconnect similar to the conductive interconnect 64*a* shown in FIG. 6A. The conductive interconnect may connect the composite circuit in the FEOL portion to circuitry external to the second die, such as the first die. Plasma-induced charges may develop during the fabrication of the conductive interconnect and its connection to the composite circuit, but the passing circuit in the composite circuit may protect the input logic gate from the uncontrolled release of such plasma-induced charges.

At step 935, a through-silicon via (TSV) may be formed in the second die. The TSV may exist in the FEOL portion and a part of the BEOL portion, in a manner exemplarily shown in FIG. 6B. Plasma-induced charges may develop during the fabrication of the TSV and its connection to the composite circuit, but the passing circuit in the composite circuit may protect the input logic gate from the uncontrolled release of such plasma-induced charges.

It is noted that the sequence shown in FIG. 9B is exemplary and non-limiting. For example, a first portion of the TSV may form during the formation of the FEOL, and a second portion of the TSV may form during the formation of the BEOL, and the two portions may then be combined to form the TSV. It is also noted that the formation of the TSV may be optional.

Refer to FIG. 9C. At step 951, die-to-die interconnects may be used to connect the first die to the second die. Various examples have been shown in FIGS. 6A-7D.

At step 953, the first die and the second die may be attached to a package substrate. Various examples have been shown in FIGS. 6A-7D.

At step 955, the first die and the second die may be at least partially encapsulated. An example can be seen in FIG. 6C.

It is noted that the sequence shown in FIG. 9C is exemplary and non-limiting.

The design and fabrication of an integrated circuit (IC) is a collective effort. FIG. 1, which is a block diagram of an IC manufacturing system 100 and an associated manufacturing flow, shows an example of how such collective effort is arranged. The system 100 may be used to fabricate, based on a layout diagram, one or more photomasks, or at least one component in a layer of an IC, or a combination of both.

The system 100 includes entities that interact and communicate with one another during the design, development, and manufacturing cycles related to the manufacturing of an IC device 160. These entities may include a design house 120, a mask house 130, and an IC manufacturer/fabricator ("fab") 150. A plurality of these entities may be owned by a single company, or may coexist in a common facility with shared resources.

The design house (or design team) 120 generates an IC design layout diagram 122 that includes various geometrical patterns for the IC device 160. These patterns may correspond to patterns of different materials (such as metal, oxide and semiconductor) and in different layers of the IC device 160, the patterns of which may combine to form various features, such as active regions, (gate) electrodes, sources/drains, metal lines, vias, openings for bonding pads, and optical devices.

The IC design layout diagram 122 is presented in data files (such as GDSII or DFII file format) with information on the patterns, and may conform to various characteristics suitable for subsequent mask and wafer fabrication.

The mask house 130 performs mask data preparation 132 and mask fabrication 144 to produce mask(s) 145 based at least in part on the layout diagram 122.

The fab 150 includes wafer fabrication 152, which turns out wafers 153 that will become IC devices 160, and may have a variety of manufacturing facilities for that end. For example, different such facilities may be employed to make the FEOL and BEOL sections. The fab 150 directly uses mask(s) 145 and therefore at least indirectly uses the layout diagram 122 in the making of the IC devices 160.

An IC device 160 may be an individual die not unlike the first die and the second die mentioned in the fabrication flowcharts with reference to FIGS. 9A-9C. That is not a limitation, however, because the fab 150 may also produce a multi-chip package as the IC device 160. The multi-chip package may include the semiconductor arrangements discussed with reference to FIGS. 2A-6C and the semiconductor packages discussed with reference to FIGS. 7A-7D.

One of the fabrication steps is the (photolithographic) transferal of patterns to the wafer 153. The patterns can be at the scale of nanometers, so their location in each of the layers has to be carefully defined during the circuit design stage. Also, the manufacturing process is carefully controlled to ensure accuracy in the placement of the patterns.

Provided in the present disclosure are apparatuses and methods for providing PID protection to the gate dielectric of an input transistor of a die connected to another die via a die-to-die interconnect. By replacing a conductive path between the die-to-die interconnect and the gate dielectric of the input transistor, undesired discharge from the die-to-die interconnect can be prevented from breaking down the gate dielectric. Moreover, exploiting the intrinsic or effective p-n junction of small-size semiconductor devices such as transistors can also help improve the provision of PID detection and reduce area overhead.

Any of the embodiments described herein may be used alone or together in any combination. The one or more implementations encompassed within this specification may also include embodiments that are only partially mentioned or alluded to or not mentioned or alluded to at all in this brief summary or in the abstract. Although various embodiments may have been motivated by various deficiencies in the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

It will be understood that not all advantages have been necessarily discussed herein, no particular advantage is required for all embodiments or examples, and other embodiments or examples may offer different advantages.

According to an aspect of the present disclosure, a circuit structure is provided. The circuit structure may include a first die area including an output logic gate, a second die area including a circuit and an input logic gate and a die-to-die interconnect. The input logic gate may include a transistor. The circuit may be connected between the die-to-die interconnect and a gate region of the transistor. The circuit may include a MOS transistor. A first source/drain region of the MOS transistor may be connected to the die-to-die interconnect.

According to an aspect of the present disclosure, a method is provided. The method may include: providing a first die that includes an output logic gate; providing a second die that includes a composite circuit that may include a passing circuit and an input logic gate; and connecting, at least partially via a die-to-die interconnect, the first die and the second die such that the output logic gate of the first die is connected to the passing circuit of the composite circuit of the second die. The input logic gate may include a transistor. The passing circuit may include a MOS transistor and may be connected to a gate region of the transistor. A first source/drain region of the MOS transistor may be connected to the die-to-die interconnect.

According to an aspect of the present disclosure, a semiconductor structure is provided. The semiconductor structure may include a first die; a second die including a first transistor; a die-to-die interconnect electrically coupling the first die and the second die; and a semi-conductive path between the die-to-die interconnect and a gate region of the first transistor. A discharge path may be electrically connected in parallel to the semi-conductive path. The discharge path may be configured to be electrically conductive in response to a presence of an amount of electric charges sufficient to break down a gate dielectric of the first transistor. The semi-conductive path may be configured to be electrically conductive in response to a presence of a control voltage being greater than a threshold voltage. The semi-conductive path may be configured to be electrically non-conductive in response to an absence of the control voltage being greater than the threshold voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit structure, comprising:
a first die area comprising an output logic gate;
a second die area comprising a circuit and an input logic gate; and
a die-to-die interconnect;
wherein the input logic gate comprises a transistor, wherein the circuit is connected between the die-to-die interconnect and a gate region of the transistor;
wherein the circuit comprises a MOS transistor,
wherein a first source/drain region of the MOS transistor is connected to the die-to-die interconnect.

2. The circuit structure of claim 1,
wherein the MOS transistor is a PMOS transistor,
wherein the circuit comprises an NMOS transistor,
wherein the first source/drain region of the PMOS transistor is connected to a first source/drain region of the NMOS transistor, and
wherein a second source/drain region of the PMOS transistor is connected to a second source/drain region of the NMOS transistor and the gate region of the transistor.

3. The circuit structure of claim 1,
wherein the MOS transistor is a first PMOS transistor,
wherein the circuit comprises a first NMOS transistor, a second PMOS transistor and a second NMOS transistor,
wherein a first source/drain region of the second PMOS transistor is connected to a first source/drain region of the second NMOS transistor and the gate region of the transistor.

4. The circuit structure of claim 3, wherein a second source/drain region of the first PMOS transistor is connected to a second source/drain region of the first NMOS transistor,
wherein a second source/drain region of the second PMOS transistor is connected to a second source/drain region of the second NMOS transistor,
wherein the second source/drain region of the first PMOS transistor is connected to the second source/drain region of the second PMOS transistor.

5. The circuit structure of claim 3, wherein a second source/drain region of the first PMOS transistor is connected to a second source/drain region of the second PMOS transistor,
a second source/drain region of the first NMOS transistor is connected to a second source/drain region of the second NMOS transistor.

6. The circuit structure of claim 1, wherein the die-to-die interconnect is electrically connected to the gate region of the transistor only via the circuit.

7. The circuit structure of claim 1, wherein the first die area comprises a first standard cell that comprises the output logic gate.

8. The circuit structure of claim 7, wherein the second die area comprises a second standard cell that comprises the input logic gate.

9. The circuit structure of claim 8, wherein the second standard cell comprises the circuit.

10. The circuit structure of claim 1, wherein the first die and the second die are in a same package.

11. The circuit structure of claim 10, wherein the package is a chip-on-wafer-on-substrate (CoWoS) package or an integrated fan-out (InFO) package.

12. A semiconductor structure, comprising:
a first die;
a second die comprising a first transistor;

a die-to-die interconnect electrically coupling the first die and the second die; and a semi-conductive path between the die-to-die interconnect and a gate region of the first transistor, wherein a discharge path is electrically connected in parallel to the semi-conductive path, wherein the discharge path is configured to be electrically conductive in response to a presence of an amount of electric charges sufficient to break down a gate dielectric of the first transistor, and wherein the semi-conductive path is configured to be electrically conductive in response to a presence of a control voltage being greater than a threshold voltage, and is configured to be electrically non-conductive in response to an absence of the control voltage being greater than the threshold voltage.

13. The semiconductor structure of claim 12, wherein the second die comprises:

a second transistor comprising a gate region, a first source/drain region and a second source/drain region, wherein the second transistor is connected between the die-to-die interconnect and the gate terminal of the first transistor.

14. The semiconductor structure of claim 13, wherein the first source/drain region of the second transistor is connected to the die-to-die interconnect.

15. The semiconductor structure of claim 14, wherein the first source/drain region of the second transistor is conductively connected to the die-to-die interconnect.

16. A circuit structure, comprising:

a first die area comprising a MOS transistor and an input logic gate having a gate region; and a die-to-die interconnect, wherein the MOS transistor is connected between the die-to-die interconnect and the gate region of the input logic gate, and wherein a first source/drain region of the MOS transistor is connected to the die-to-die interconnect.

17. The circuit structure of claim 16, wherein the MOS transistor is a PMOS transistor, wherein the first die area further comprises an NMOS transistor, wherein the first source/drain region of the PMOS transistor is connected to a first source/drain region of the NMOS transistor, and wherein a second source/drain region of the PMOS transistor is connected to a second source/drain region of the NMOS transistor and the gate region of the input logic gate.

18. The circuit structure of claim 16, wherein the MOS transistor is a first PMOS transistor, wherein the first die area further comprises a first NMOS transistor, a second PMOS transistor and a second NMOS transistor, wherein a first source/drain region of the second PMOS transistor is connected to a first source/drain region of the second NMOS transistor and the gate region of the input logic gate.

19. The circuit structure of claim 18, wherein a second source/drain region of the first PMOS transistor is connected to a second source/drain region of the first NMOS transistor, wherein a second source/drain region of the second PMOS transistor is connected to a second source/drain region of the second NMOS transistor, wherein the second source/drain region of the first PMOS transistor is connected to the second source/drain region of the second PMOS transistor.

20. The circuit structure of claim 18, wherein a second source/drain region of the first PMOS transistor is connected to a second source/drain region of the second PMOS transistor, a second source/drain region of the first NMOS transistor is connected to a second source/drain region of the second NMOS transistor.

* * * * *